United States Patent [19]
Setlak

[11] Patent Number: 5,963,679
[45] Date of Patent: *Oct. 5, 1999

[54] ELECTRIC FIELD FINGERPRINT SENSOR APPARATUS AND RELATED METHODS

[75] Inventor: Dale R. Setlak, Melbourne, Fla.

[73] Assignee: Harris Corporation, Melbourne, Fla.

[ * ] Notice: This patent issued on a continued prosecution application filed under 37 CFR 1.53(d), and is subject to the twenty year patent term provisions of 35 U.S.C. 154(a)(2).

[21] Appl. No.: 08/592,469

[22] Filed: Jan. 26, 1996

[51] Int. Cl.$^6$ .............................. G06K 7/00; G06K 9/00
[52] U.S. Cl. .......................... 382/312; 382/124; 382/115
[58] Field of Search ................................ 382/312, 324, 382/124–127, 321, 115, 223, 274, 261, 270, 275, 205, 211; 283/78; 73/862.046

[56] References Cited

U.S. PATENT DOCUMENTS

| | | | |
|---|---|---|---|
| 3,781,672 | 12/1973 | Maltby et al. | 324/663 |
| 3,781,855 | 12/1973 | Killen | 340/146.3 E |
| 3,859,633 | 1/1975 | Ho et al. | 340/146.3 E |
| 3,959,884 | 6/1976 | Jordan et al. | 33/1 BB |
| 4,140,272 | 2/1979 | Atalla | 235/380 |
| 4,151,512 | 4/1979 | Riganati et al. | 340/146.3 E |
| 4,156,230 | 5/1979 | Riganati et al. | 340/146.3 E |
| 4,185,270 | 1/1980 | Fischer, II et al. | 340/146.3 E |
| 4,210,899 | 7/1980 | Swonger et al. | 340/146.3 E |
| 4,336,998 | 6/1982 | Ruell | 356/71 |
| 4,353,056 | 10/1982 | Tsikos | 340/146.3 |
| 4,394,773 | 7/1983 | Ruell | 382/4 |
| 4,429,413 | 1/1984 | Edwards | 382/4 |
| 4,525,859 | 7/1985 | Bowles et al. | 382/5 |
| 4,526,043 | 7/1985 | Boie et al. | 73/862.04 |

(List continued on next page.)

FOREIGN PATENT DOCUMENTS

| | | | |
|---|---|---|---|
| 0 040 838 | 12/1981 | European Pat. Off. | A61B 5/10 |
| 0 041 693 | 12/1981 | European Pat. Off. | A61B 5/10 |
| 0 044 489 A1 | 1/1982 | European Pat. Off. | A61B 5/10 |
| 0 459 808 | 12/1991 | European Pat. Off. | G06K 11/12 |
| 0 513 612 A2 | 11/1992 | European Pat. Off. | G06K 9/46 |
| WO 94/25938 | 10/1994 | European Pat. Off. | G07C 9/00 |
| 2674051-A1 | 9/1992 | France | G06K 9/62 |
| 4026-167-A | 5/1991 | Germany | G06K 9/28 |
| 403036791 | 1/1991 | Japan | G06K 9/00 |
| 404190470 | 7/1992 | Japan | G06K 9/00 |
| 2 219 870 | 12/1989 | United Kingdom | G02B 5/08 |

OTHER PUBLICATIONS

R.P. James, *IBM Technical Disclosure Bulletin*, vol. 14, No. 11 (Apr. 1972), "Finger–Print Sensor", p. 3361.

Masahiro Takeda, Satoshi Uchida, Kenichi Hiramatsu & Tokumi Matsunami, "Finger Image Identification Method for Personal Verification," IEEE, pp. 761—766 (1990).

*Primary Examiner*—Thomas D. Lee
*Assistant Examiner*—Wenpeng Chen
*Attorney, Agent, or Firm*—Allen, Dyer, Doppelt, Milbrath & Gilchrist, P.A. Attorneys at Law

[57] ABSTRACT

A fingerprint sensor includes an array of electric field sensing electrodes, a dielectric layer on the sensing electrodes with the dielectric layer for receiving a finger adjacent thereto, and a driver for applying an electric field drive signal to the sensing electrodes and adjacent portions of the finger so that the sensing electrodes produce a fingerprint image output signal. In one embodiment of the invention, the driver provides a coherent drive signal for the array. A respective shield electrode may be associated with each of the electric field sensing electrodes for shielding each electric field sensing electrode from adjacent sensing electrodes. Each shield electrode may be actively driven for further shielding. The fingerprint sensor preferably further includes a synchronous demodulator and contrast enhancer for more accurate output image signals. The fingerprint sensor may be effectively used to control access to a computer workstation. Method aspects are also disclosed.

51 Claims, 10 Drawing Sheets

U.S. PATENT DOCUMENTS

| | | | |
|---|---|---|---|
| 4,577,345 | 3/1986 | Abramov | 382/4 |
| 4,581,760 | 4/1986 | Schiller et al. | 382/4 |
| 4,582,985 | 4/1986 | Löfberg | 235/380 |
| 4,747,147 | 5/1988 | Sparrow | 382/4 |
| 4,845,610 | 7/1989 | Parvin | 364/200 |
| 4,932,776 | 6/1990 | Dowling, Jr. et al. | 357/71 |
| 4,947,443 | 8/1990 | Costello | 382/5 |
| 4,993,068 | 2/1991 | Piosenka et al. | 380/23 |
| 5,010,772 | 4/1991 | Bourland et al. | 73/862.04 |
| 5,040,223 | 8/1991 | Kamiya et al. | 382/4 |
| 5,040,224 | 8/1991 | Hara | 382/4 |
| 5,050,220 | 9/1991 | Marsh et al. | 382/4 |
| 5,140,642 | 8/1992 | Hsu et al. | 382/5 |
| 5,239,590 | 8/1993 | Yamamoto | 382/4 |
| 5,294,989 | 3/1994 | Moore et al. | 348/241 |
| 5,325,442 | 6/1994 | Knapp | 382/4 |
| 5,337,357 | 8/1994 | Chou et al. | 380/4 |
| 5,351,304 | 9/1994 | Yamamoto | 382/5 |
| 5,363,453 | 11/1994 | Gagne et al. | 382/5 |
| 5,373,181 | 12/1994 | Scheiter et al. | 257/415 |
| 5,400,662 | 3/1995 | Tamori | 73/862.046 |
| 5,420,936 | 5/1995 | Fitzpatrick et al. | 382/124 |
| 5,429,006 | 7/1995 | Tamori | 73/862.046 |
| 5,436,972 | 7/1995 | Fischer | 380/25 |
| 5,465,303 | 11/1995 | Levison et al. | 382/124 |
| 5,488,719 | 1/1996 | Kaplan et al. | 395/600 |
| 5,497,429 | 3/1996 | Shibuya | 382/125 |
| 5,503,029 | 4/1996 | Tamori | 73/862.046 |
| 5,526,701 | 6/1996 | Tamori | 73/862.046 |
| 5,559,504 | 9/1996 | Itsumi et al. | 340/825.3 |

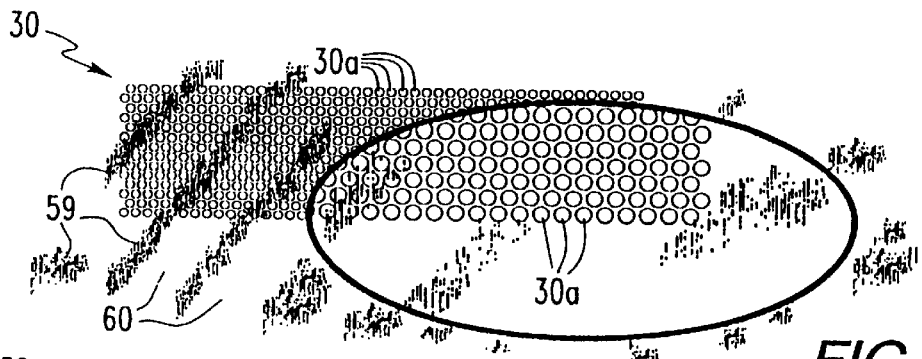
FIG. 4
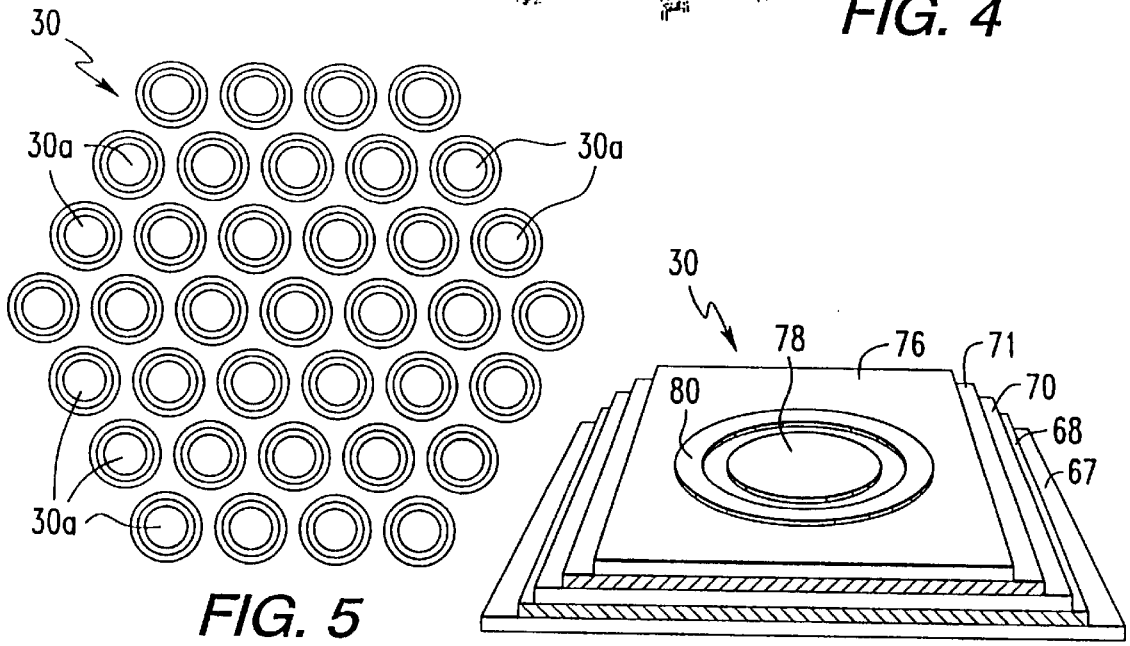
FIG. 5
FIG. 6
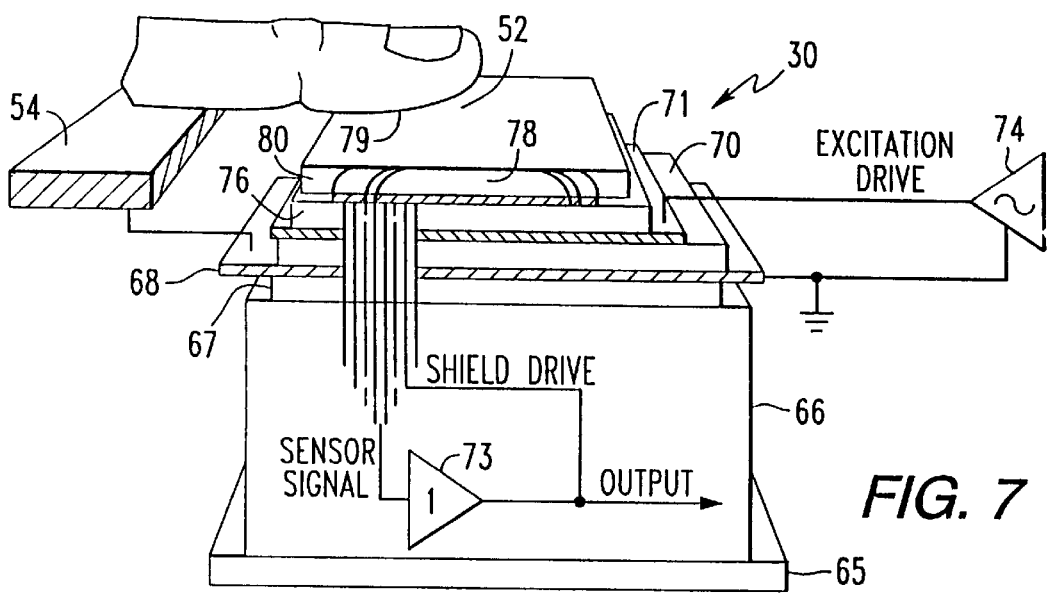
FIG. 7

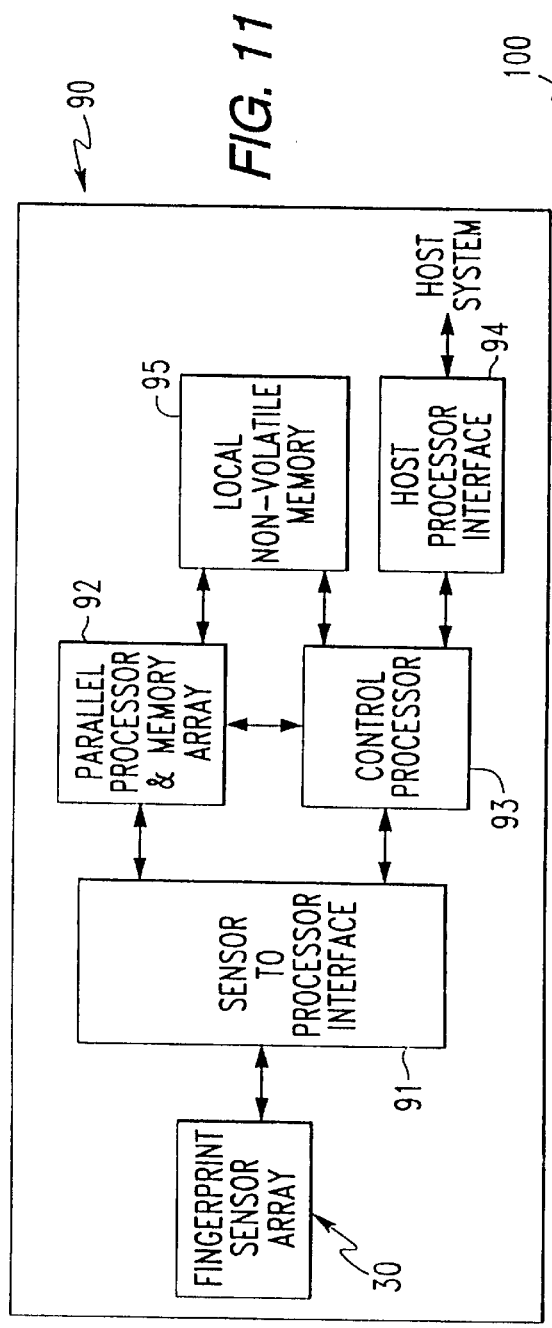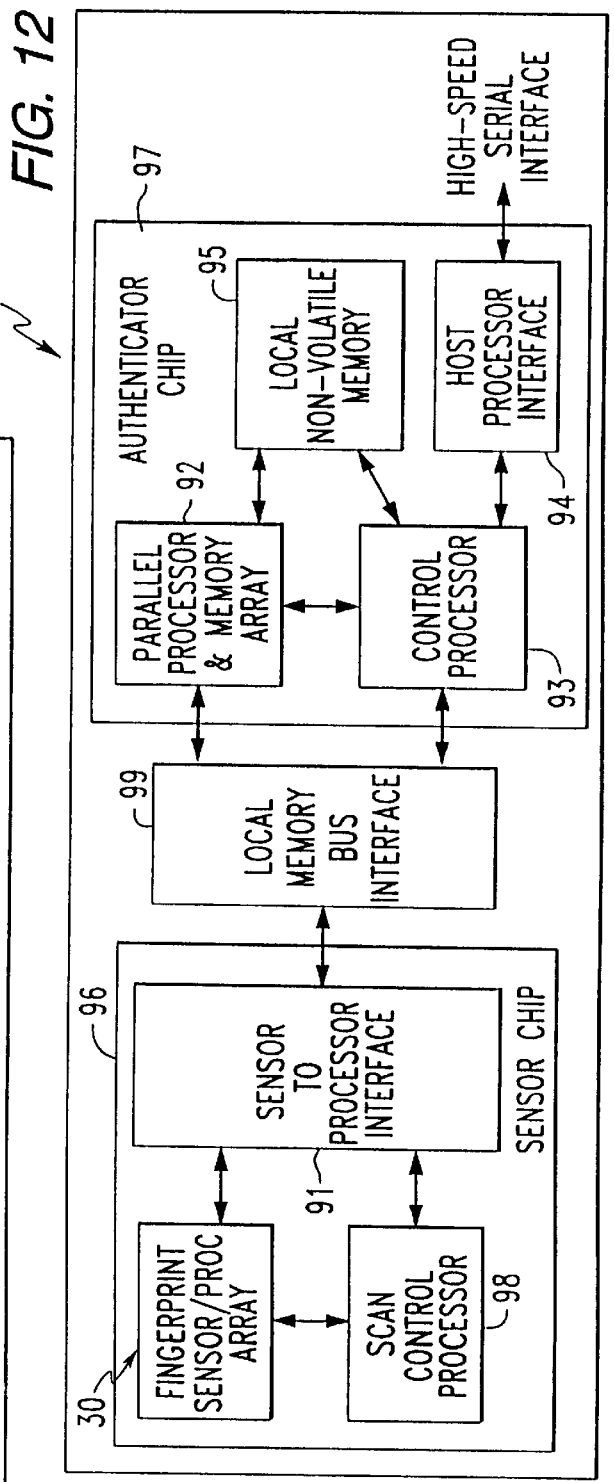

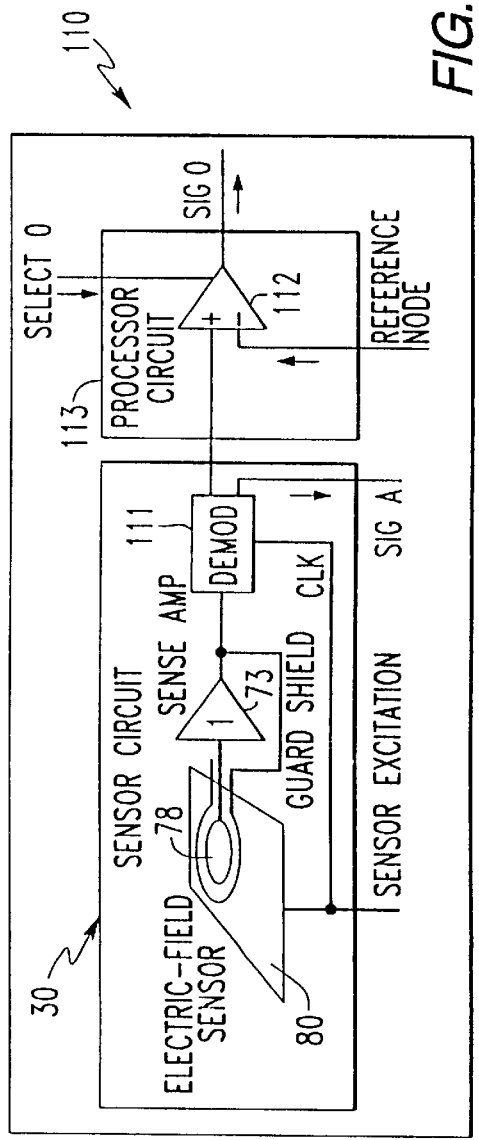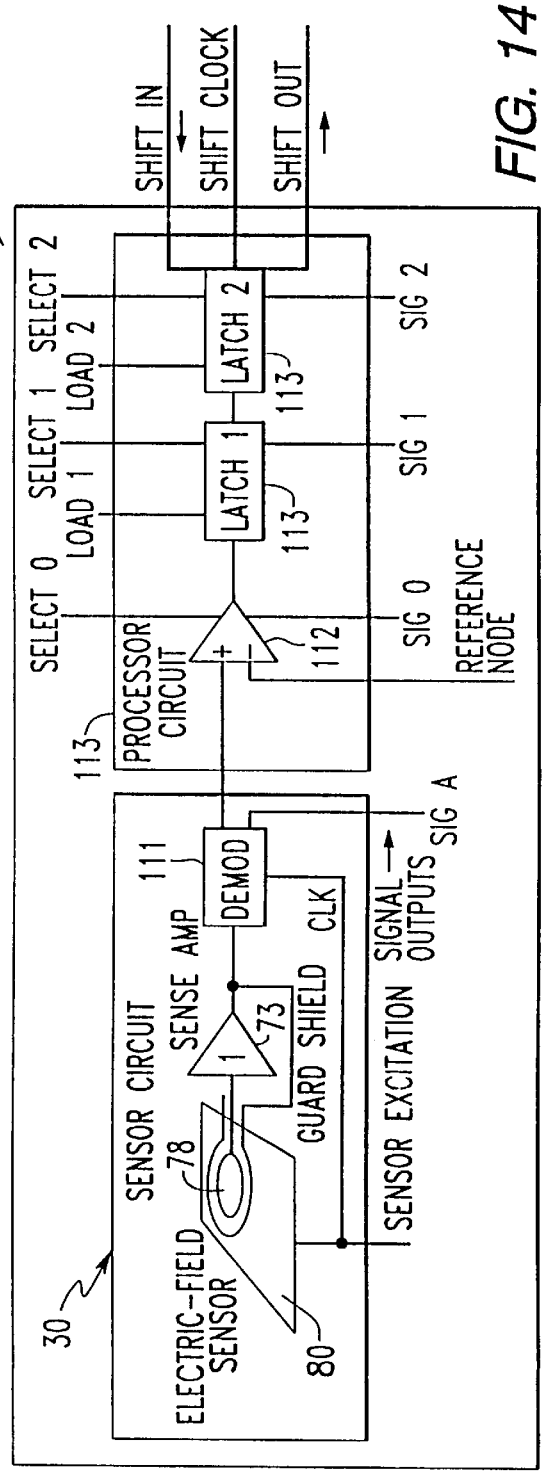

ELECTRIC FIELD FINGERPRINT SENSOR APPARATUS AND RELATED METHODS

FIELD OF THE INVENTION

The present invention relates to the field of personal identification and verification, and, more particularly, to the field of fingerprint sensing and processing.

BACKGROUND OF THE INVENTION

Fingerprint sensing and matching is a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in storage to determine proper identification of a person, such as for verification purposes.

A typical electronic fingerprint sensor is based upon illuminating the finger surface using visible light, infrared light, or ultrasonic radiation. The reflected energy is captured with some form of camera, for example, and the resulting image is framed, digitized and stored as a static digital image. For example, U.S. Pat. No. 4,210,899 to Swonger et al. discloses an optical scanning fingerprint reader cooperating with a central processing station for a secure access application, such as admitting a person to a location or providing access to a computer terminal. U.S. Pat. No. 4,525,859 to Bowles similarly discloses a video camera for capturing a fingerprint image and uses the minutiae of the fingerprints, that is, the branches and endings of the fingerprint ridges, to determine a match with a database of reference fingerprints.

Unfortunately, optical sensing may be affected by stained fingers or an optical sensor may be deceived by presentation of a photograph or printed image of a fingerprint rather than a true live fingerprint. In addition, optical schemes may require relatively large spacings between the finger contact surface and associated imaging components. Moreover, such sensors typically require precise alignment and complex scanning of optical beams. Accordingly, optical sensors may thus be bulky and be susceptible to shock, vibration and surface contamination. Accordingly, an optical fingerprint sensor may be unreliable in service in addition to being bulky and relatively expensive due to optics and moving parts.

In the event of a failure to form an acceptable image of a fingerprint, U.S. Pat. No. 4,947,443 to Costello, for example, discloses a series of indicator lights which give the user a simple go or no-go indication of the acceptability of the fingerprint scanning among other potential system identification failures. In other words, another shortcoming of conventional fingerprint sensors is that inaccurate positioning of the finger relative to the sensor may reduce the ability of the processor to accurately and quickly determine a match between a sample fingerprint and a plurality of reference fingerprints.

U.S. Pat. No. 4,353,056 to Tsikos discloses another approach to sensing a live fingerprint. In particular, the patent discloses an array of extremely small capacitors located in a plane parallel to the sensing surface of the device. When a finger touches the sensing surface and deforms the surface, a voltage distribution in a series connection of the capacitors may change. The voltages on each of the capacitors is determined by multiplexor techniques. Unfortunately, the resilient materials required for the sensor may suffer from long term reliability problems. In addition, multiplexing techniques for driving and scanning each of the individual capacitors may be relatively slow and cumbersome. Moreover, noise and stray capacitances may adversely affect the plurality of relatively small and closely spaced capacitors.

U.S. Pat. No. 5,325,442 to Knapp discloses a fingerprint sensor including a plurality of sensing electrodes. Active addressing of the sensing electrodes is made possible by the provision of a switching device associated with each sensing electrode. A capacitor is effectively formed by each sensing electrode in combination with the respective overlying portion of the finger surface which, in turn, is at ground potential. The sensor may be fabricated using semiconductor wafer and integrated circuit technology. The dielectric material upon which the finger is placed may be provided by silicon nitride or a polyimide which may be provided as a continuous layer over an array of sensing electrodes. Further conductors may be provided on the surface of the dielectric material remote from the sensing electrodes and extending over regions between the sensing electrodes, for example, as lines or in grid form, which conductors are grounded in order to improve the electrical contact to the finger surface.

Unfortunately, driving the array of closely spaced sensing electrodes as disclosed in the Knapp et al. patent may be difficult since adjacent electrodes may affect one another. Another difficulty with such a sensor may be its ability to distinguish ridges and valleys of a fingerprint when the conductivity of the skin and any contaminants may vary widely from person-to-person and even over a single fingerprint. Yet another difficulty with such a sensor, as with many optical sensors, is that different portions of the fingerprint may require relatively complicated post image collection processing to provide for usable signal levels and contrast to thereby permit accurate determination of the ridges and valleys of the fingerprint.

Yet another shortcoming of conventional fingerprint sensors is that the leads and internal components of a conventional fingerprint sensor, either optical, ultrasonic or capacitive, may be tampered with, such as to send a false acceptance signal to an associated portion of equipment. Accordingly, even if the sensor is accurate and reliable, it may be readily bypassed to gain access or entry to the equipment or area intended to be protected by the fingerprint sensor.

Greater advances in fingerprint sensing and matching for identification and verification are desirable and may prevent unauthorized use of computer workstations, appliances, vehicles, and confidential data. Inexpensive and effective fingerprint identification may also be used at point-of-sale terminals, and ensure further security of credit and debit cards, firearms, and provide a personal electronic signature. Unfortunately, current sensors and their associated circuitry may be too bulky, expensive and unreliable for a great many applications which would otherwise benefit from fingerprint identification and verification technology.

SUMMARY OF THE INVENTION

It is therefore an object of the present invention to provide a fingerprint sensor and related methods for accurately sensing a fingerprint, and which sensor is rugged, compact, reliable and relatively inexpensive.

These and other objects, features and advantages according to the invention are provided by a fingerprint sensor comprising an array of electric field sensing electrodes, a dielectric layer on the electric field sensing electrodes with the dielectric layer for receiving a finger adjacent thereto, and drive means for applying an electric field drive signal to the electric field sensing electrodes and adjacent portions of the finger so that the electric field sensing electrodes produce a fingerprint image output signal. Accordingly, the many shortcomings and disadvantages of prior art optical sensors are thus overcome, as the sensor in accordance with the present invention may be readily made to be rugged, compact, relatively low cost, and accurate.

In one advantageous embodiment of the invention the drive means preferably comprises coherent drive means for driving the array with a coherent signal. More particularly, the coherent drive means may include a drive electrode adjacent the electric field sensing electrodes, a second dielectric layer between the drive electrode and the electric field sensing electrodes, and a drive circuit for powering the drive electrode to generate the coherent electric field drive signal with a predetermined frequency. The sensor also preferably includes a finger electrode positioned adjacent the dielectric layer for contact with the finger.

Another important embodiment and aspect of the invention includes a respective shield electrode associated with each of the electric field sensing electrodes for shielding each electric field sensing electrode from adjacent sensing electrodes. Each shield electrode may be provided by an electrically conductive layer surrounding a respective sensing electrode with a dielectric layer therebetween. To further reduce the driving requirement for each sensing electrode and reduce the undesirable effects of adjacent electrodes, the fingerprint sensor preferably further comprises active shield driving means for actively driving each of the shield electrodes. The active shield driving means may be provided by an amplifier operatively connected to each electric field sensing electrode and each shield electrode for actively driving the shield electrode with a portion of an output signal from the amplifier.

Yet another significant aspect of the invention addresses the difficulty of variation in finger conductivity and contamination. More particularly, the fingerprint sensor preferably further includes synchronous demodulator means operatively connected to the electric field sensing electrodes for synchronously demodulating signals therefrom so that sensitivity to variations in conductivity is reduced.

Still another significant aspect of the present invention relates to image contrast and uniformity enhancement which has typically been attempted via complicated and relatively slow downstream software driven processing of a fingerprint image signal. The present invention advantageously includes dynamic contrast enhancing means operatively connected to the electric field sensing electrodes and within the integrated circuit of the sensor for dynamically enhancing contrast and uniformity of the fingerprint image output signal.

In one embodiment, the dynamic contrast enhancing means may be provided by a capacitor matrix operatively connected to the electric field sensing electrodes, and an alternating current (AC) capacitor matrix drive means for driving the capacitor matrix. In addition, the AC capacitor matrix drive means may be provided, in part, by the synchronous demodulator described above. In an alternate embodiment, the dynamic contrast enhancing means may comprise a resistor array or matrix operatively connected to the electric field sensing electrodes.

The fingerprint sensor may desirably be implemented using semiconductor processing techniques and wherein the upper dielectric layer, upon which the finger is placed, is an upper exposed portion of the semiconductor chip containing the sensing and drive electrodes, as well as associated active electronic circuitry. In particular, an amplifier may be operatively connected to each electric field sensing electrode, and multiplexing means provided for selectively reading each of the electric field sensing electrodes. The sensor may also preferably include package means in one embodiment for enclosing the substrate, the active semiconductor layer, the electric field sensing electrodes, and the dielectric layer. The package means preferably has an opening therethrough in registry with the dielectric layer.

The fingerprint sensor may be used in many applications. In one preferred application the sensor is used in combination with a computer workstation, such as a fixed workstation or a portable notebook computer. In other words, the computer workstation preferably comprises a housing, a computer processor positioned within the housing, a display operatively connected to the computer processor, a keyboard operatively connected to the computer processor, and fingerprint sensor means mounted within and protected by the housing and operatively connected to the computer processor.

Moreover, the fingerprint sensor may interface with the computer processor so that the electronics associated with the sensor may be simplified and their expense thereby reduced. Thus, the computer processor preferably comprises access control means for permitting operation of the computer workstation only upon determining a match between a fingerprint sensed by the protectively mounted fingerprint sensor and an authorized reference fingerprint. The fingerprint sensor may be the electric field fingerprint sensor described herein or other sensors may be used.

Method related aspects of the invention are also disclosed herein.

BRIEF DESCRIPTION OF THE DRAWINGS

FIG. 4 is a schematic plan view of a portion of the sensor and an overlying fingerprint pattern in accordance with the present invention with a portion thereof greatly enlarged for clarity of illustration.

FIG. 5 is a greatly enlarged plan view of a portion of the fingerprint sensor in accordance with the invention with the upper dielectric layer removed therefrom for clarity of illustration.

FIG. 6 is a schematic perspective view of a portion of the fingerprint sensor in accordance with the present invention.

FIG. 7 is a schematic fragmentary view of a portion of the fingerprint sensor in accordance with the present invention.

FIG. 11 is a schematic block diagram of the fingerprint sensor and associated circuitry in one embodiment in accordance with the present invention.

FIG. 12 is a schematic block diagram of the fingerprint sensor and associated circuitry in another embodiment in accordance with the present invention.

FIG. 13 is a schematic block diagram of an embodiment of a sensor circuit in accordance with the present invention.

FIG. 14 is a schematic block diagram of another embodiment of a sensor circuit in accordance with the present invention.

DETAILED DESCRIPTION OF THE PREFERRED EMBODIMENTS

Figure 1:
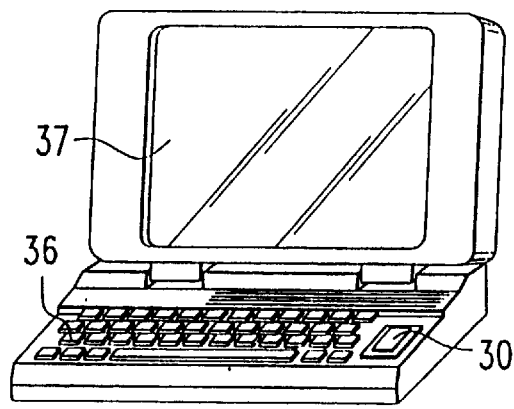
FIG. 1 is a schematic diagram of the fingerprint sensor in combination with a notebook computer in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The scaling of various features, particularly fingers and layers in the drawing figures, have been exaggerated for clarity of explanation.

Figure 2:
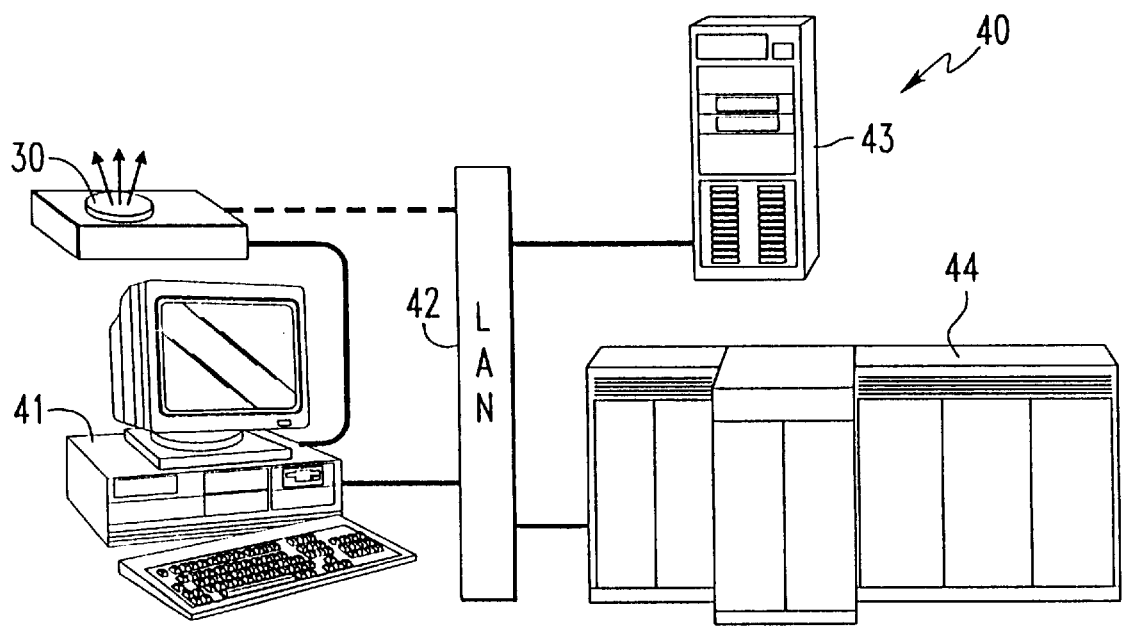
FIG. 2 is a schematic diagram of the fingerprint sensor in combination with a computer workstation and associated information processing computer and local area network (LAN) in accordance with the present invention.
Figure 3:
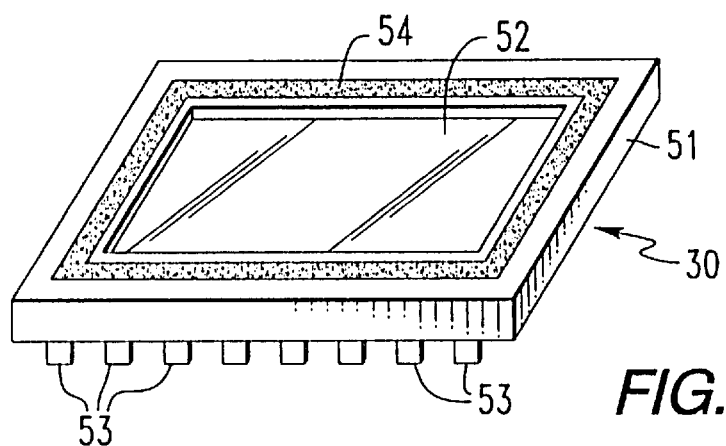
FIG. 3 is a schematic perspective view of an embodiment of a fingerprint sensor in accordance with the invention.

Referring first to FIGS. 1–3, the fingerprint sensor 30 in accordance with the invention is initially described. The illustrated sensor 30 includes a housing or package 51, a dielectric layer 52 exposed on an upper surface of the package which provides a placement surface for the finger, and a plurality of signal conductors 53. A conductive strip or electrode 54 around the periphery of the dielectric layer 52 also provides a contact electrode for the finger as described in greater detail below. The sensor 30 may provide output signals in a range of sophistication levels depending on the level of processing incorporated in the package as also described in greater detail below.

The fingerprint sensor 30 may be used in many different applications as will be readily appreciated by those skilled in the art, such as for personal identification or verification purposes. For example, the sensor 30 may be used to permit access to a computer workstation, such as a notebook computer 35 including a keyboard 36 and associated folding display screen 37 (FIG. 1). In other words, user access to the information and programs of the notebook computer 35 may only be granted if the desired fingerprint is first sensed as also described in greater detail herein.

Another application of the fingerprint sensor 30 is illustrated with particular reference to FIG. 2. The sensor 30 may be used to grant or deny access to a fixed workstation 41 for a computer information system 40. The system may include a plurality of such workstations 41 linked by a local area network (LAN) 43, which in turn, is linked to a fingerprint identification server 43, and an overall central computer 44. Many other applications for the low cost and reliable electric field sensor 30 in accordance with the invention are contemplated by the invention and will be readily appreciated by those skilled in the art.

Referring now additionally to FIGS. 4–10, the sensor 30 is described in greater detail. The sensor 30 includes a plurality of individual pixels or sensing elements 30a arranged in array pattern as shown perhaps best in FIGS. 4 and 5. As would be readily understood by those skilled in the art, these sensing elements are relatively small so as to be capable of sensing the ridges 59 and intervening valleys 60 of a typical fingerprint (FIG. 4). As will also be readily appreciated by those skilled in the art, live fingerprint readings as from the electric field sensor 30 in accordance with the present invention may be more reliable than optical sensing, because the conduction of the skin of a finger in a pattern of ridges and valleys is extremely difficult to simulate. In contrast, an optical sensor may be deceived by a readily prepared photograph or other similar image of a fingerprint, for example.

The sensor 30 includes a substrate 65, and one or more active semiconductive layers 66 thereon. A ground plane electrode layer 68 is above the active layer 66 and separated therefrom by an insulating layer 67. A drive electrode layer 71 is positioned over another dielectric layer 70 and is connected to an excitation drive amplifier 74. The excitation drive signal may be typically in the range of about 1 KHz to 1 MHz and is coherently delivered across all of the array. Accordingly, the drive or excitation electronics are thus relatively uncomplicated and the overall cost of the sensor 30 may be reduced, while the reliability is increased.

Another insulating layer 76 is on the drive electrode layer 71, and an illustratively circularly shaped sensing electrode 78 is on the insulating layer 76. The sensing electrode 78 may be connected to sensing electronics 73 formed in the active layer 66 as schematically illustrated, and as would be readily appreciated by those skilled in the art.

An annularly shaped shield electrode 80 surrounds the sensing electrode 78 in spaced relation therefrom. As would be readily appreciated by those skilled in the art the sensing electrode 78 and its surrounding shield electrode 80 may have other shapes, such as hexagonal, for example, to facilitate a close packed arrangement or array of pixels or sensing elements 30a. The shield electrode 80 is an active shield which is driven by a portion of the output of the amplifier circuit 73 to help focus the electric field energy and, moreover, to thereby reduce the need to drive adjacent electrodes. Accordingly, the sensor 30 permits all of the sensing elements to be driven by a coherent drive signal in sharp contrast to prior art sensors which required that each sensing electrode be individually driven.

Figure 8:
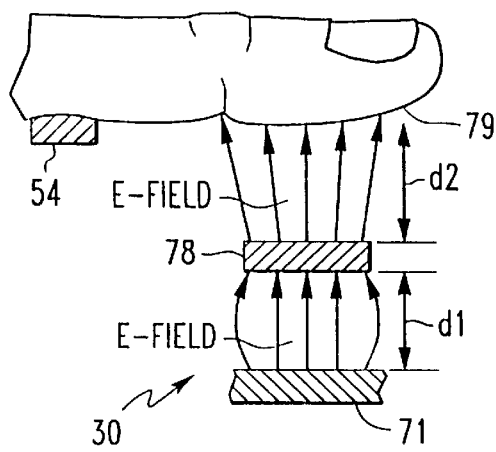
FIG. 8 is a schematic side view, partially in section, illustrating the electric fields in accordance with the present invention.
Figure 9:
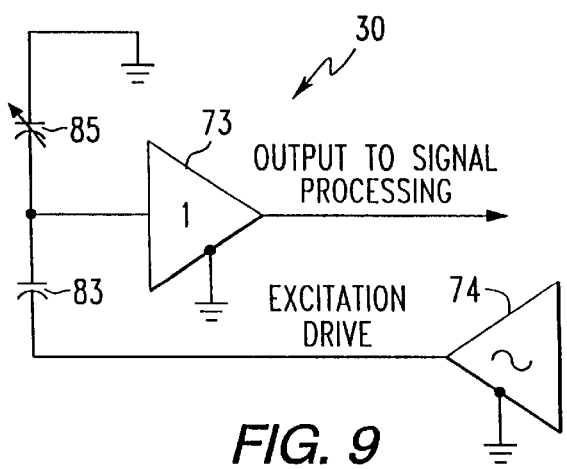
FIG. 9 is a schematic circuit diagram of a portion of the fingerprint sensor in accordance with the present invention.
Figure 10:
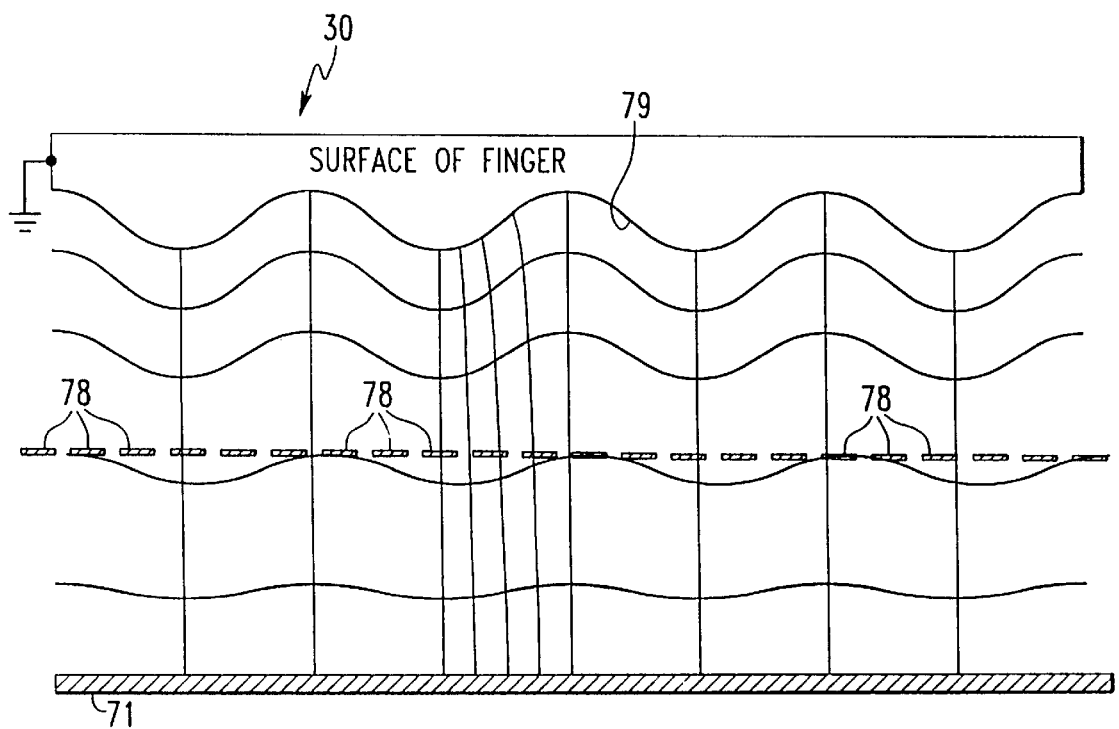
FIG. 10 is an enlarged schematic side view, partially in section, further illustrating the electric fields in accordance with the present invention.

As understood with additional reference to FIGS. 8–10, the excitation electrode 71 generates a first electric field to the sensing electrode 78 and a second electric field between the sensing electrode 78 and the surface of the finger 79, over the distances d1 and d2, respectively. In other terms, a first capacitor 83 (FIG. 9) is defined between the excitation electrode 71 and the sensing electrode 78, and a second capacitor 85 is defined between the finger skin 79 and ground. The capacitance of the second capacitor 85 varies depending on whether the sensing electrode 78 is adjacent a ridge or valley. Accordingly, the sensor 30 can be modeled as a capacitive voltage divider. The voltage sensed by the unity gain voltage follower or amplifier 73 will change as the distance d2 changes.

In general, the sensing elements 30a operate at very low currents and at very high impedances. For example, the output signal from each sensing electrode 78 is desirably about 5 to 10 millivolts to reduce the effects of noise and permit further processing of the signals. The approximate diameter of each sensing element 30a, as defined by the outer dimensions of the shield electrode 80, may be about 0.002 to 0.005 inches in diameter. The excitation dielectric layer 76 and surface dielectric layer 52 may desirably have a thickness in the range of about 1 $\mu$m. The ground plane electrode 68 shields the active electronic devices from the excitation electrode 71. A relatively thick dielectric layer 67 will reduce the capacitance between these two structures and thereby reduce the current needed to drive the excitation electrode. The various signal feedthrough conductors for the electrodes 78, 80 to the active electronic circuitry may be readily formed as would be understood by those skilled in the art. In addition, the illustrated signal polarities may be readily reversed as would also be readily understood by those skilled in the art.

The overall contact or sensing surface for the sensor 30 may desirably be about 0.5 by 0.5 inches —a size which may be readily manufactured and still provide a sufficiently large surface for accurate fingerprint sensing and identification. The sensor 30 in accordance with the invention is also fairly tolerant of dead pixels or sensing elements 30a. A typical sensor 30 includes an array of about 256 by 256 pixels or sensor elements, although other array sizes are also contemplated by the present invention. The sensor 30 may also be fabricated at one time using primarily conventional semiconductor manufacturing techniques to thereby significantly reduce the manufacturing costs.

Referring now additionally to FIG. 11, functional partitioning of an apparatus 90 including the fingerprint sensor 30 is described. The fingerprint sensor apparatus 90 may be configured to provide one or more of displacement sensing of the fingerprint, provide an image present trigger, perform analog-to-digital conversion, provide full image capture and image integrity determination, provide contrast enhancement and normalization, and provide image binarization. In the illustrated embodiment, the sensor 30 is connected to a parallel processor and memory array 92, and control processor 93 via the illustrated interface 91. The parallel processor 92 may provide image quality and bad block determinations; provide edge enhancement and smoothing and thinning; generate ridge flow vectors, smooth the vectors and generate ridge flow characteristics as may be desired for fingerprint matching; identify the center of the fingerprint; generate, smooth and clean curves; and provide minutiae identification. The illustrated control processor 93 may provide minutiae registration and matching, minutiae storage, generate authorization codes, and communicate with the host via the illustrated interface 94. The illustrated local non-volatile memory 95 may also be included in the apparatus 90.

A variation of the apparatus 90 of FIG. 11 is illustrated by the apparatus 100 of FIG. 12. This embodiment includes a two chip version of the sensor and processing electronics. The apparatus 100 includes a sensor chip 96 and an authenticator chip 97 connected via a local memory bus interface 99. A scan control processor 98 is also included in the illustrated embodiment of FIG. 12, while the remaining functional components are the same as in FIG. 11 and need no further description herein.

Demodulation and preliminary processing of the detected signals from the sensor 30 are further understood with reference to FIGS. 13 and 14. Both of the illustrated circuits 110, 120 desirably use an alternating current excitation. In addition, the amplitude of the voltage on the sensor is proportional to the displacement of the local ground plane, hence, the signal has to be demodulated before further use. FIG. 13 illustrates a local comparator 112 to allow the control to manage the A/D conversion process in parallel. The processor can present a sequence of a reference voltages to an entire row or column of pixels or sensor elements 30a and monitor the transitions on the SigO lines. A successive approximation conversion could be implemented, first stepping large steps, and then stepping in progressively finer steps over a smaller range, as would be readily understood by those skilled in the art. The SigO output can be a binary bus connection while the SigA output is a demodulated analog signal that can be used as part of analog reference voltage generating circuit, as would also be readily understood by those skilled in the art.

The circuit 120 illustrated in FIG. 14 has storage to do localized contrast enhancement for all sensor units or pixels simultaneously. The computation can use the analog comparator 112 for a decision element. The binarized output image can be shifted out of the binary shift registers provided by the illustrated latches 113. Alternately, the output image could by read out as with conventional memory array addressing as would be readily understood by those skilled in the art. Since the circuit 120 has its own local memory, it does not need a separate set of buffers to store the pixel data.

Variations in skin conductivity and contamination may cause phase shift of the electric field signal. Accordingly, the processing electronic circuits 110, 120 of FIGS. 13 and 14 preferably include a synchronous demodulator or detector 111 so that the overall circuit has less sensitivity to any such variations in conductivity.

Figure 15:
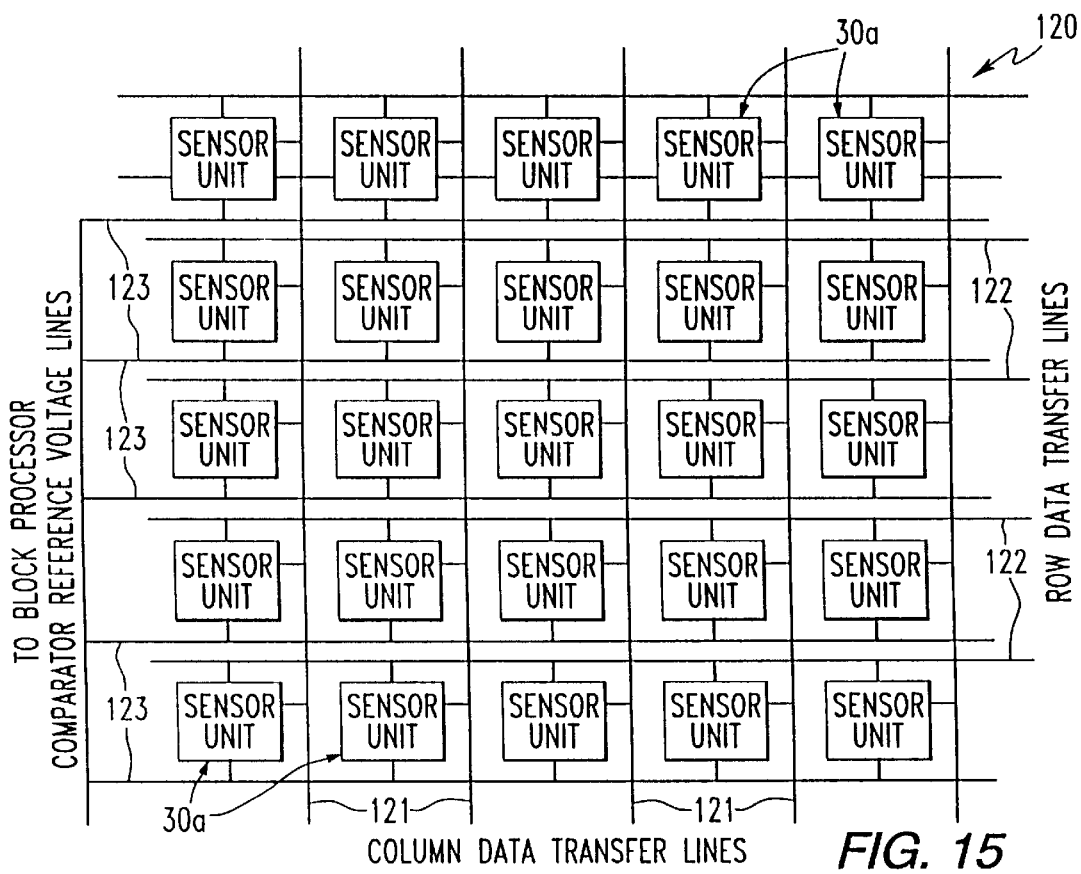
FIG. 15 is a schematic block diagram illustrating a plurality of sensor units in accordance with the present invention.

Interconnections of the sensor units or pixels 30a in a portion of an array are schematically illustrated in FIG. 15.

Column data transfer lines 121, row data transfer lines 122, and comparator reference lines 123 are shown connected to the array of sensor units 30a. The interconnections may be desirably made in an 8-by-8 block of sensor units, although other configurations are also contemplated by the present invention.

Figure 16:
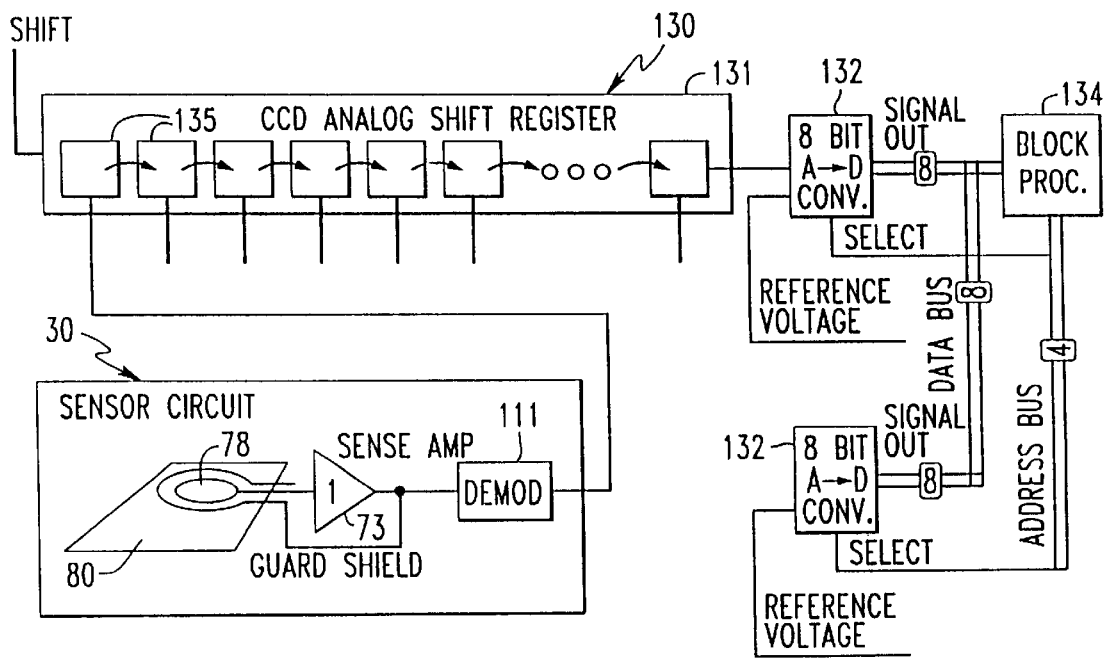
FIG. 16 is a schematic block diagram of an embodiment of a portion of the signal processing for the fingerprint sensor in accordance with the present invention.
Figure 17:
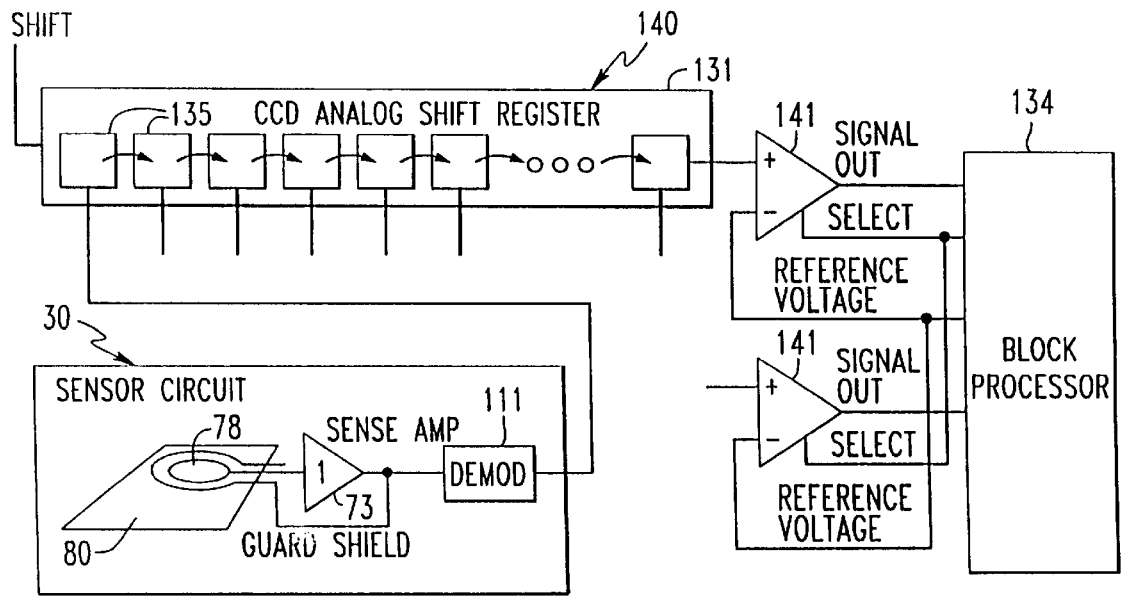
FIG. 17 is a schematic block diagram of another embodiment of a portion of the signal processing for the fingerprint sensor in accordance with the present invention.

Further embodiments of various processor circuitry is understood with reference to FIGS. 16 and 17. The circuit 130 of FIG. 16 includes a charge coupled device (CCD) shift register 131 which, in turn, includes a plurality of individual shift registers 135. The shift registers 131 function as a tapped delay line to facilitate image signal processing. The registers 135 feed respective A/D converters 132 operated under control of the illustrated block processor 134. The sensing amplifier outputs are connected to the CCD analog shift registers 135, with one shift register per row of pixels. A row of data is then shifted out of the register either to an A/D converter 132 which serves as the active conversion device. Each pixel is converted to an 8 bit digital word as it arrives at the converter. The conversion process and the A-to-D reference voltage are under control of block processors, where each block processor may control one or more rows, such as, for example, 16 rows per each processor. A limited degree of dynamic contrast compensation can be achieved using data from the previous pixel conversion to scale the reference voltage; however, significant downstream digital image processing may still be required.

The circuit 140 of FIG. 17 is similar to that of FIG. 16. In FIG. 17, a comparator 141 operates under control of the illustrated block processor 134 to provide the image output signals as would be readily understood by those skilled in the art.

Figure 18:
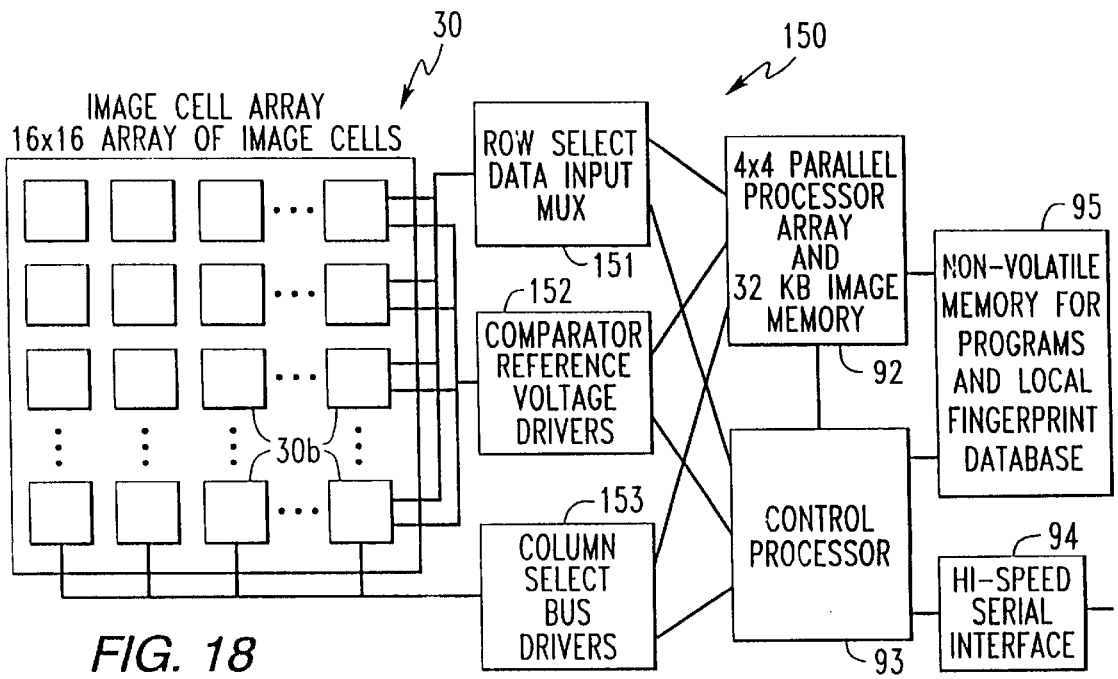
FIG. 18 is a schematic block diagram of yet another embodiment of signal processing circuitry for the fingerprint sensor in accordance with the present invention.

Turning now additionally to FIG. 18, another aspect of the signal processing configurations in accordance with the invention is described. This circuit embodiment 150 is similar to that embodiment illustrated in FIG. 11 and described above. The circuit 150 of FIG. 18 illustratively includes a 16-by-16 array of sensor units or image cells 30b selectively addressed and read by the illustrated row select data input multiplexor 151, column select bus drivers 153, and comparator reference voltage dividers 152. Once an image has been captured from the electric field sensing electrodes and digitized, fingerprint features can be extracted from the image. FIG. 18 illustrates a high level view of a sensor connected to a bank of digital signal processors 92. A 128×128 pixel array, in this instance, has been partitioned into a 16×16 array of image cells 30b, wherein each image cell is formed of an 8×8 pixel array.

Each image cell 30b has a single comparator reference line that services the entire cell. When a cell 30b is being scanned, one of the parallel processors manages the reference voltage for that cell 30b and records the digitized signals for all of the sensors in that cell. During the process of scanning the sensors in the cell 30b, the processor can simultaneously correlate the data from the cell to generate a preliminary estimate of the ridge flow direction in that cell. In the illustrated embodiment, a control processor 93 manages the sensor signal scanning and digitization, and supervises a bank of parallel processors 92 that perform feature extraction and matching functions. The other illustrated components are similar to those discussed above with reference to FIG. 11 and, hence, need no further discussion.

Figure 19:
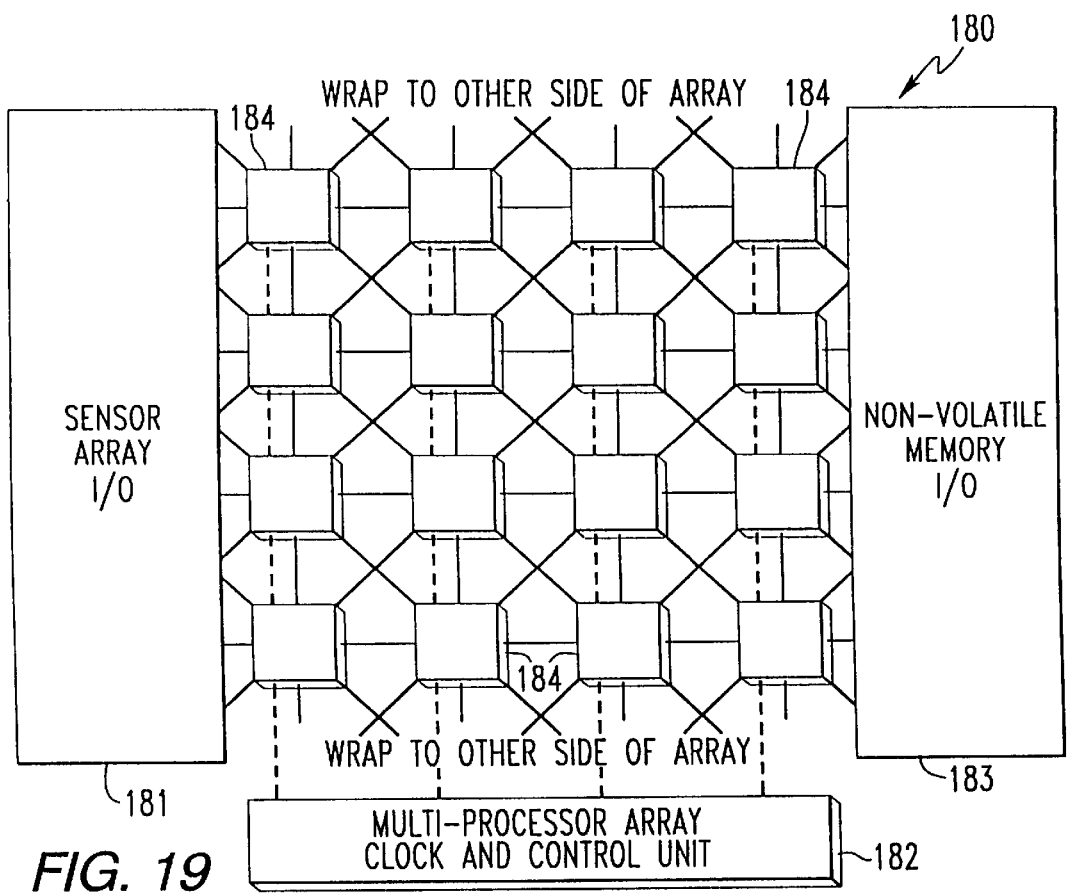
FIG. 19 is a schematic circuit diagram of yet another embodiment of a portion of the signal processing for the fingerprint sensor in accordance with the present invention.

Turning now additionally to FIG. 19, a 4×4 processor matrix circuit 180, such as might be used for a pipeline style implementation of the fingerprint minutiae processing, is illustrated. The circuit 180 includes an array of processors 184, a sensor array input/output portion 181, a non-volatile memory interface 183, and the illustrated multi-processor array clock and control unit 182. The illustrated circuit 180 may be used to identify and locate the fingerprint's unique minutiae to determine a match between a sensed fingerprint and one of a plurality of reference fingerprints. In other words, the processors 184 may match the minutiae against a set of previously stored reference minutia, to complete the identification process. When a positive identification has been made, for example, the circuit 180 may notify an external processor by sending an appropriately encrypted message over a host processor interface.

Figure 20:
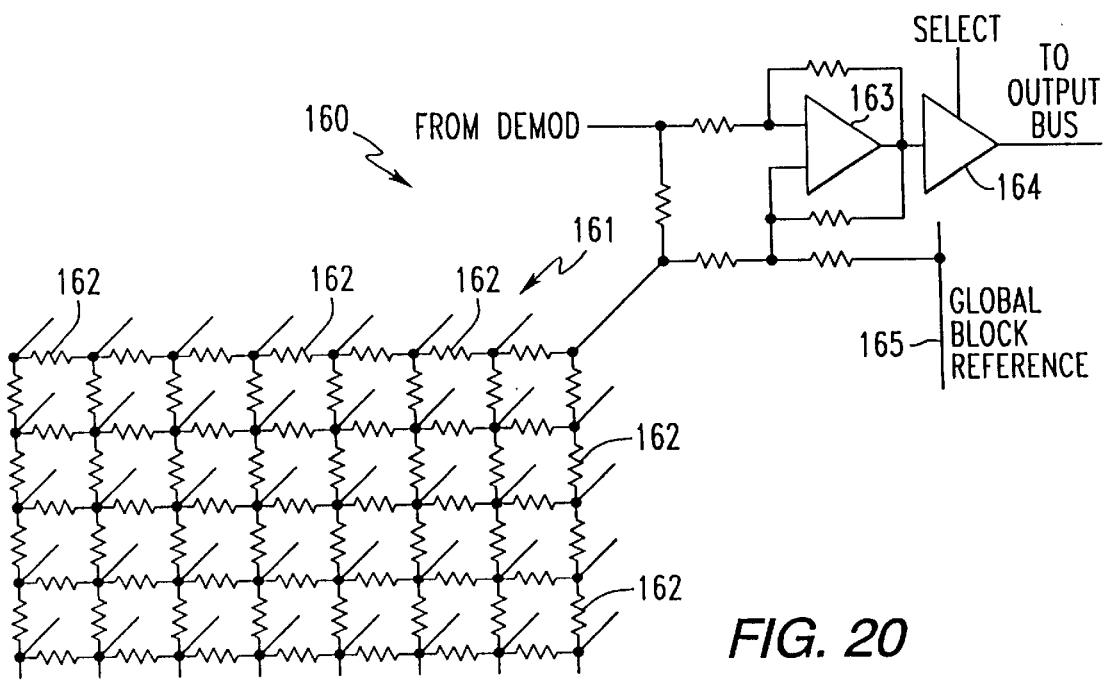
FIG. 20 is a schematic circuit diagram of yet another embodiment of a portion of the signal processing for the fingerprint sensor in accordance with the present invention illustrating a resistor matrix for dynamic contrast enhancement.

There is a general need to ensure sufficient contrast between the ridges and valleys of the fingerprint over the entire area of the fingerprint. The circuit 160 of FIG. 20 schematically illustrates a resistive network or matrix 161 including a plurality of interconnected resistors 162 for providing dynamic contrast enhancement for the array of pixels 30a. The effect of adjacent pixels is used to normalize the output of each pixel and while providing sufficient contrast. The circuit includes a pair of amplifiers 163, 164 for providing the enhanced contrast output signals.

Each pixel's value is determined by comparing the sensor signal to a reference signal that sums the block reference signal with a weighted average of the signals from all of the sensors in the immediate area. The square resistive grid or matrix provides the necessary weighted average to each of the pixel comparators simultaneously. The global block reference line 165 is preferably driven with a staircase waveform while the comparator outputs are monitored for change of state. Each pixel's gray-scale value may be determined by noting which step of the staircase causes that pixel's comparator to change state as would be readily understood by those skilled in the art.

Figure 21:
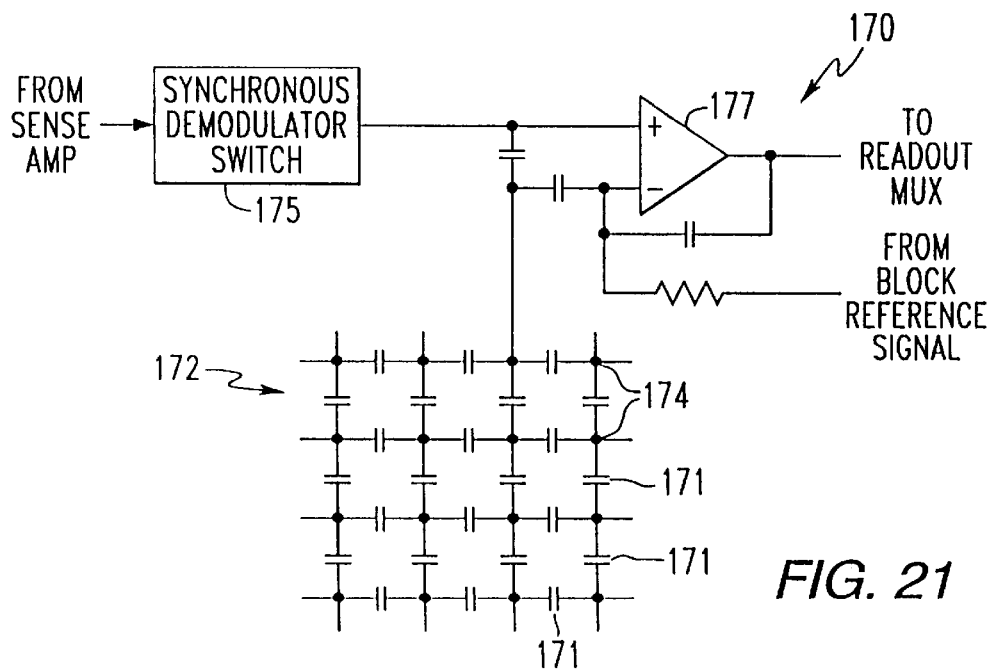
FIG. 21 is a schematic circuit diagram of yet another embodiment of a portion of the signal processing for the fingerprint sensor in accordance with the present invention illustrating a capacitor matrix implementation for dynamic contrast enhancement.

A variation for dynamic contrast enhancement is understood with reference to the circuit 170 of FIG. 21. Dynamic contrast enhancement can also be implemented by an array 172 of capacitors 171 interconnecting the pixel nodes 174. In this embodiment, the array 172 receives an alternating current signal derived from the synchronous demodulator 175 described in greater detail above. The capacitors 171 serve as an AC impedance network distributing and averaging the AC signals in a fashion analogous to the behavior of the resistive network 161 (FIG. 20) for DC signals. In the AC contrast enhancing circuit 170, the lowpass filtering that in other embodiments may be part of the demodulator circuit, is moved to the comparator 177 circuit portion. The capacitor array 172 is readily implemented using conventional semiconductor processing techniques and may offer an advantage of relatively small size as compared to the resistor array implementation described above and as would be readily appreciated by those skilled in the art.

The resistive matrix circuit 160 and capacitor matrix circuit 170 may provide weighting for image contrast enhancement. An alternative is to conduct such enhancement via downstream software which may take a relatively long time to fully process.

Accordingly, the resistor matrix and capacitor matrix arrangement may provide greater overall processing speed. In addition, such preliminary processing at the sensor 30 may allow relaxation of A/D conversion from an 8 bit AD converter to a 1 bit converter in some embodiments, while still providing high speed and at a relatively low cost. For example, processing of the fingerprint image and determination of a match may desirably take only several seconds for certain applications to avoid user frustration.

Figure 22:
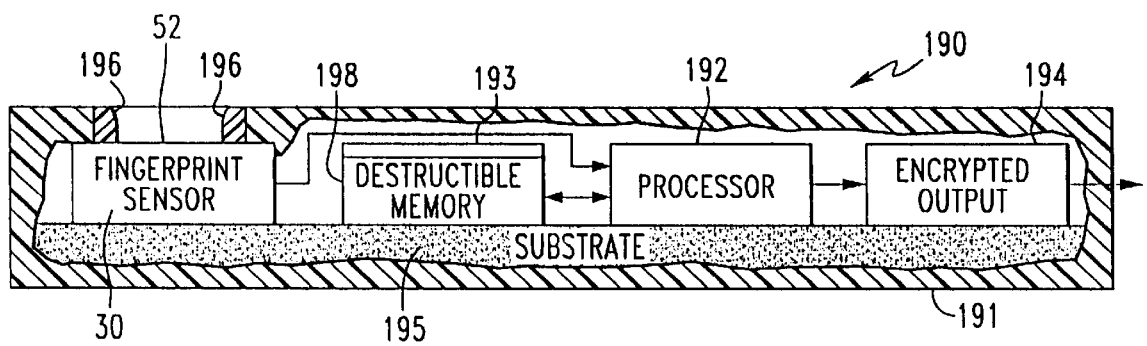
FIG. 22 is a schematic block diagram of an embodiment of the fingerprint sensor package in accordance with the present invention.

Referring now additionally to FIG. 22, another aspect of the invention is described wherein the sensor 30 may be contained within a secure sensor package 190. The sensor 30 is desirably mounted to prevent flexing or shifting which may stress the chip or its electrical connections. More particularly, the overall package may include a tamper resistant housing 191 as would be readily understood by those skilled in the art. For example, the housing 191 may be formed of a hard plastic material or metal that is strong and resistant to cutting, abrading or sawing. Alternately, the housing 191 may be a material which crumbles and destroys its internal circuit components if cutting, dissolution, or other forms of entry are attempted.

Those of skill in the art will appreciate other variations of tamper resistant housings 191 as contemplated by the present invention.

The sensor package 190 also includes the illustrated substrate 195, processor 192, destructible memory 195, and encrypted output circuit 194. More particularly, the encrypted output circuit 194 provides an output signal that can only be decrypted by the intended downstream device. Such encryption techniques will be readily understood by those skilled in the art and may include the use of various keys, passwords, codes, etc. as will also be readily understood by those skilled in the art. For example, U.S. Pat. Nos. 4,140,272; 5,337,357; 4,993,068 and 5,436,972 each disclose various approaches to encryption and the disclosures of these patents are incorporated herein in their entirety by reference.

The output of the sensor package 190 may be communicated to associated downstream decryption equipment via electrically conductive leads or pins, or may be inductively or optically coupled to associated equipment as will be readily understood by those skilled in the art. As would also be understood by those skilled in the art, electrical or other types of protection may be provided on the encrypted output portion to ensure that data, such as a database of fingerprints stored on the memory 193, is not readily readable by external connections and/or signal manipulations.

The sensor 30 and processor 192 may be configured to provide any of a range of integral sensor processing features. For example, the encrypted output may be a raw image, a processed image, fingerprint minutiae data, a yes/no match indication, or personal identification and digital signature keys as would be readily understood by those skilled in the art.

The illustrated sensor package 190 also includes a bead 196 of sealing material at the interface between the upper dielectric layer 52 of the sensor 30 and the adjacent portions of the housing 191. Other sealing arrangements are also contemplated by the present invention, for desirably providing a fluid tight seal at the interface between the exposed upper dielectric layer and the adjacent housing portions. In addition, a cleaning liquid may be used to routinely clean the window and reduce the contamination thereof. Since various alcohols, such as isopropyl alcohol are likely to be used as cleaning solutions, the housing 191 and sealing bead 196 are desirably resistant to such chemicals as would be readily understood by those skilled in the art.

Figure 23:
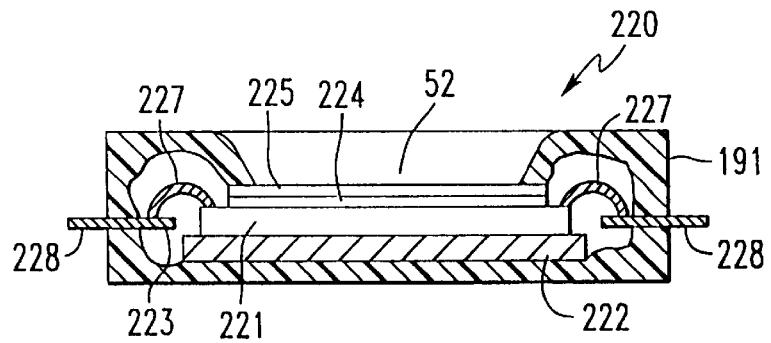
FIG. 23 is a schematic diagram of another embodiment of the fingerprint sensor package in accordance with the present invention.

Turning now additionally to FIG. 23 another sensor package 220 is illustrated, and the problems and solutions with respect to an integrated circuit package in accordance with the present invention are discussed. As would be readily understood by those skilled in the art, a fingerprint sensor integrated circuit presents a special packaging difficulty since it has to be touched by the finger being scanned.

It is typically desired to avoid touching of an integrated circuit in conventional integrated circuit fabrication, in part, because of potential contamination. The main contaminants of concern are sodium and the other alkaline metals. These contaminants may cause mobile ions in the $SiO_2$ layers that are typically used to passivate the integrated circuit. The resulting oxide charge degrades device characteristics especially in MOS technology.

One conventional approach to controlling mobile ionic contamination uses hermetic packaging with a phosphorus-doped passivation layer over the integrated circuit. The phosphorus doping reduces contaminant mobility by trapping mechanisms as would be readily understood by those skilled in the art. Plastic packaging has now become more widespread, and a silicon nitride passivation layer may be used with the plastic packaging. Silicon nitride may greatly reduce the permeability to contaminants to permit direct contact between the finger of the user and the integrated circuit. Accordingly, silicon nitride may preferably be used as a passivation layer of the fingerprint sensor in accordance with the present invention.

A fingerprint sensor as in the present invention also raises several unique packaging requirements including: the package needs to be open to enable finger-to-sensor die contact; the package should be physically strong in order to withstand rough use; the package and die should be able to withstand repeated cleaning with detergent and/or disinfectant solutions, and including scrubbing; the die should be able to withstand contact with a wide variety of organic and inorganic contaminants, and should be able to withstand abrasion; and finally the package should be relatively inexpensive.

The illustrated package 220 of FIG. 23 addresses these packaging issues. The package 220 includes an integrated circuit die 221 mounted on a metal paddle 222 that is connected to the leadframe 223 during injection molding of the surrounding plastic material 191 of the package. Connections are made by bond wires 227 and the lead frame 223 to the outwardly extending leads 228 as would be readily understood by those skilled in the art. The upper surface of the plastic housing 191 includes an integrally molded opening 52 which permits contact to the die 221. The adhesion between the plastic molding compound and the adjacent upper surface portions of the die creates a seal in this illustrated embodiment. Accordingly, no separate sealing compound or manufacturing step may be needed as would be readily understood by those skilled in the art.

The integrated circuit die 221 may also include a passivation layer 224 of silicon nitride for reasons highlighted above. In addition, as shown in the illustrated sensor package 220, the die 221 may be provided with a second protective coating 225. Each of the coatings 224, 225 are desirably relatively thin, such as on the order of about a micrometer, in order to retain sensor sensitivity. The outer coating 225 may be an organic material, such as polyimide or PTFE (Teflon™) which yields advantages in wear resistance and physical protection. Inorganic coatings, such as silicon carbide or amorphous diamond, may also be used for the outer layer 225 and may greatly enhance wear resistance, especially to abrasive particles. In addition, the material of the protective die coating 225 is preferably compatible with standard IC pattern definition methods in order to enable bond pad etching, for example.

The bond pads on the integrated circuit die 221 may be provided by aluminum. Another perhaps more preferable approach seals the pads with a gold plug, as may be applied by electroplating, as would be readily understood by those skilled in the art. As would also be readily understood by those skilled in the art, in order to reduce the height created by the looped bond wires 227, the die 221 may be directly flip-chip bonded in another embodiment of the invention, not shown. As would be readily understood by those skilled in the art, the sensor package 220 in other embodiments may be manufactured using tape automated bonding techniques.

Returning again briefly to FIG. 22, yet another aspect of the sensor package 190 is that the memory 198 and/or other integrated circuit components may be made to destruct or be rendered secure upon breach of the housing 191, for example. A coating 193 of material may be applied to the integrated circuit die(s) that causes destruction of the die if the coating is dissolved away as would be readily understood by those skilled in the art. The memory 193 may also self-destruct or empty its contents upon exposure to light or upon removal of a sustaining electrical current. Those of skill in the art will readily appreciate other approaches to ensuring the integrity of the data and processing capabilities of the sensor package 190 in accordance with the present invention. Accordingly, the present invention provides that sensitive data, such as a database of authorized fingerprints, encryption keys, or authorization codes, are not readily stolen from the sensor package 190. In addition, although the sensor package 190 may desirably incorporate the electrical field sensor 30 as described extensively herein, other sensors are also contemplated for inclusion with a secure sensor package in accordance with this aspect of the invention.

The various embodiments of the sensor 30 and its associated processing circuitry may implement any of a number of conventional fingerprint matching algorithms. For example, a suitable fingerprint matching algorithm and indexing approach for quick and efficient searching is described in copending patent application entitled "Methods and Related Apparatus for Fingerprint Indexing and Searching", having Ser. No. 08/589,064, assigned to the assignee of the present invention and the entire disclosure of which is incorporated herein by reference in its entirety.

As would be readily understood by those skilled in the art, fingerprint minutiae, that is, the branches or bifurcations and end points of the fingerprint ridges, are often used to determine a match between a sample print and a reference print database. Such minutiae matching may be readily implemented by the processing circuitry of the present invention as would be readily understood by those skilled in the art. For example, U.S. Pat. Nos. 3,859,633 and 3,893,080 both to Ho et al. are directed to fingerprint identification based upon fingerprint minutiae matching. U.S. Pat. No. 4,151,512 to Riganati et al., for further example, describes a fingerprint classification method using extracted ridge contour data. U.S. Pat. No. 4,185,270 to Fischer II et al. discloses a process for encoding and verification also based upon minutiae. In addition, U.S. Pat. No. 5,040,224 to Hara discloses an approach to preprocessing fingerprints to correctly determine a position of the core of each fingerprint image for later matching by minutiae patterns. The entire disclosures of each of these U.S. patents are incorporated herein by reference.

Figure 24:
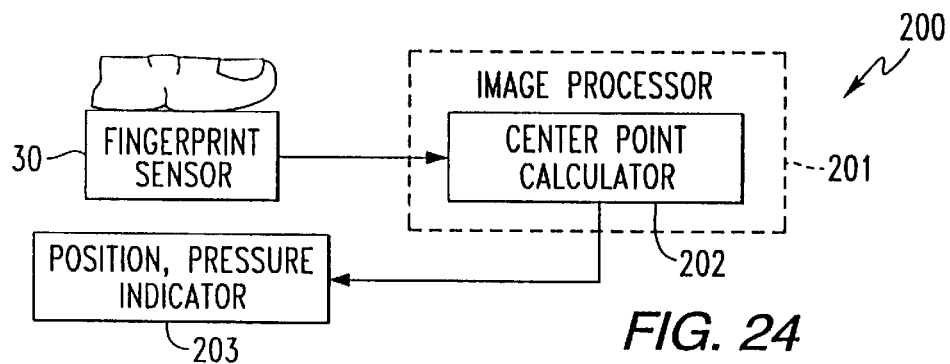
FIG. 24 is a schematic block diagram of another aspect of the sensor for illustrating near real-time positioning feedback of finger placement in accordance with the invention.
Figure 25:
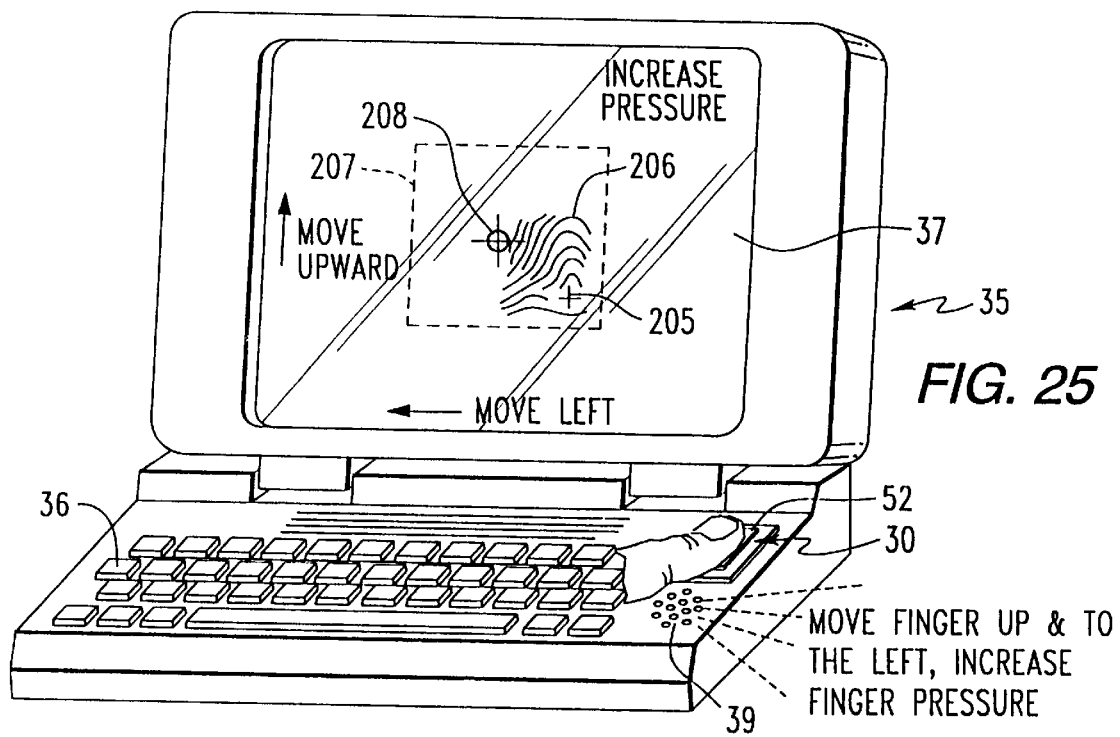
FIG. 25 is a schematic perspective diagram of a computer illustrating near real-time positioning feedback of finger placement in accordance with the present invention.
Figure 26:
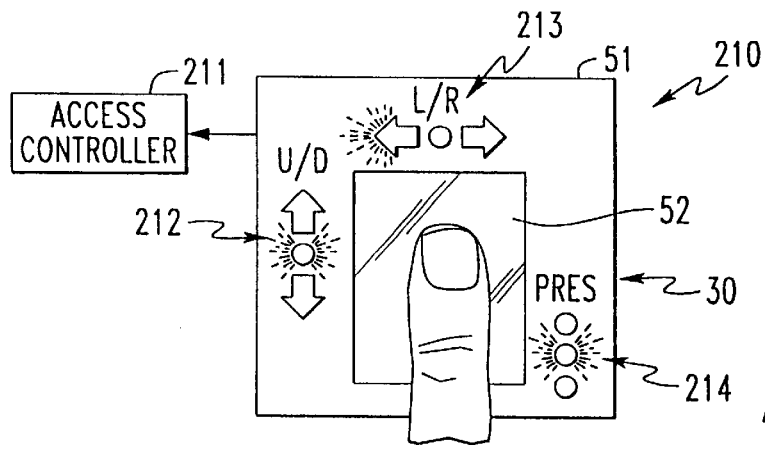
FIG. 26 is a schematic perspective diagram of a fingerprint sensor including indicators for illustrating near real-time positioning feedback of finger placement in accordance with the present invention.

Turning now lastly to FIGS. 24–26 another significant aspect of the present invention is described. Because of the relatively fast and efficient processing of a fingerprint image provided by above identified sensor 30 and associated circuitry of the invention, the user may be provided with nearly real-time feedback regarding positioning of his finger on a fingerprint sensor, such as the illustrated electric field sensor 30. Accordingly, the user may quickly and accurately reposition his finger, have his identification accurately determined, and promptly move forward with the intended task. In the past only a simple go or no-go indication has been described for a user as in U.S. Pat. No. 4,947,443 to Costello, for example, and with such an indication most likely taking a relatively long time. It is generally understood that unless such an indication can be given within several seconds, user frustration is likely to rise dramatically with any further passage of time. Moreover, a simple go/no-go indication may only prompt the user to try again without any useful guidance on what may be causing the no-go indication.

The apparatus 200 (FIG. 24) illustratively includes a fingerprint sensor 30 operatively connected to an image processor 201. Along the lines as discussed above, the image processor 201 may include the tapped delay line or other functional center point calculator 202 for determining a center point from the sensed fingerprint as will be readily appreciated by those skilled in the art. The location of the center point relative to a predetermined reference center point may be determined and an indication given the user via a position indicator 203. The image may also be further analyzed, and if the applied finger pressure is too great or too little, such an indication may also be given to the user. Accordingly, potential user frustration may be significantly reduced. A need to clean the sensor may also be effectively communicated to the user if repositioning and/or pressure changes are ineffective, such as after a predetermined number of attempts.

Turning now more particularly to FIG. 25, a practical implementation of the position feedback sensing and indication is further described as applied in a computer workstation, such as the illustrated notebook computer 35 of the type including a keyboard 36 and display 37. Those of skill in the art will recognize the applicability of this aspect of the invention to many types of fixed and portable computer workstations in addition to the illustrated notebook computer.

In the illustrated embodiment, the fingerprint sensor 30 receives the finger of the user. The processor of the computer in cooperation with the fingerprint sensor 30 generates a display of the fingerprint image 206 along with its center point 205 on an image of a window 207 on the display 37. In the illustrated embodiment, the display also includes a target center point 208 to assist the user is repositioning his finger for an accurate reading.

In addition to the visual image indication, a further indication may be given by display of the words "move upward" and "move left" along with the illustrated associated directional arrows. An indication may also be given concerning a desired pressure, such as the illustrated words "increase pressure".

Yet another variation of the feedback and pressure indications may be in the form of synthetically generated speech messages issued from a speaker 39 mounted within the housing of the computer. For example, the generated voice messages illustratively include an annunciation to "move finger up and to the left" and "increase finger pressure". Other helpful messages are also contemplated by the present invention.

Still another embodiment of finger position feedback sensing and indication is understood with further reference to the apparatus 210 of FIG. 26. In this embodiment, the sensor 30 is used to operate an access controller 211 which, in turn, may operate a door, for example, to permit a properly identified user to enter. Simple visual indications in the form of LEDs 212, 213 for up and down motion, and left and right motion, respectively, may be provided to indicate to the user the proper positioning or repositioning of his finger. The illustrated embodiment also includes a plurality of LEDs 214 for indication of pressure. Those of skill in the art will readily appreciate many other variations and alternate embodiments of the feedback sensing and positioning in accordance with this aspect of the present invention.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A fingerprint sensor comprising:
 an array of electric field sensing electrodes;
 a dielectric layer on a first surface of said array of electric field sensing electrodes, said dielectric layer for receiving a finger adjacent thereto; and
 coherent drive means for applying a coherent electric field drive signal to said array of electric field sensing electrodes and adjacent portions of the finger so that said array of electric field sensing electrodes produce a fingerprint image output signal, said coherent drive means comprising
  a second dielectric layer on a second surface of said array of electric field sensing electrodes opposite the first surface, and
  a common drive electrode extending beneath at least a plurality of electric field sensing electrodes of said array of electric field sensing electrodes with the second dielectric layer therebetween so that the electric field drive signal radiates vertically between said common drive electrode and electric field sensing electrodes.

2. A fingerprint sensor according to claim 1 wherein said coherent drive means further comprises a drive circuit for powering said common drive electrode to generate the coherent electric field drive signal having a predetermined frequency.

3. A fingerprint sensor according to claim 1 further comprising a finger electrode positioned adjacent said dielectric layer for contact with the finger.

4. A fingerprint sensor according to claim 1 further comprising a respective shield electrode associated with each of said electric field sensing electrodes for shielding each electric field sensing electrode from adjacent sensing electrodes.

5. A fingerprint sensor according to claim 4 wherein each shield electrode comprises an electrically conductive layer surrounding a respective electric field sensing electrode with a dielectric layer therebetween.

6. A fingerprint sensor according to claim 4 further comprising active shield driving means for actively driving each of said shield electrodes.

7. A fingerprint sensor according to claim 6 wherein said active shield driving means comprises an amplifier operatively connected to each electric field sensing electrode and its associated shield electrode for actively driving the shield electrode with a portion of an output signal from said amplifier.

8. A fingerprint sensor according to claim 1 further comprising synchronous demodulator means operatively connected to said electric field sensing electrodes for synchronously demodulating signals therefrom.

9. A fingerprint sensor according to claim 1 further comprising dynamic contrast enhancing means operatively connected to said electric field sensing electrodes for dynamically enhancing contrast and uniformity of the fingerprint image output signal.

10. A fingerprint sensor according to claim 9 wherein said dynamic contrast enhancing means comprises:
 a capacitor matrix operatively connected to said electric field sensing electrodes; and
 alternating current capacitor matrix drive means for driving said capacitor matrix.

11. A fingerprint sensor according to claim 10 wherein said alternating current capacitor matrix drive means comprises a synchronous demodulator.

12. A fingerprint sensor according to claim 9 wherein said dynamic contrast enhancing means comprises a resistor matrix operatively connected to said electric field sensing electrodes.

13. A fingerprint sensor according to claim 1 further comprising an amplifier operatively connected to each electric field sensing electrode.

14. A fingerprint sensor according to claim 1 further comprising multiplexing means for selectively reading each of said electric field sensing electrodes.

15. A fingerprint sensor according to claim 1 further comprising:
 a substrate; and
 an active semiconductor layer on said substrate comprising a plurality of semiconductor devices operatively connected to said electric field sensing electrodes.

16. A fingerprint sensor according to claim 15 further comprising package means for enclosing said substrate, said active semiconductor layer, said electric field sensing electrodes, and said dielectric layer; and wherein said package means has an opening therethrough in registry with said dielectric layer.

17. A fingerprint sensor comprising:
 an array of electric field sensing electrodes;
 a dielectric layer on said electric field sensing electrodes, said dielectric layer for receiving a finger adjacent thereto;
 a respective shield electrode associated with each of said electric field sensing electrodes for shielding each electric field sensing electrode from adjacent electric field sensing electrodes; and
 drive means for applying an electric field drive signal to said electric field sensing electrodes and adjacent portions of the finger, said drive means comprising a common drive electrode extending beneath at least a plurality of electric field sensing electrodes of said array of electric field sensing electrodes so that the electric field drive signal radiates vertically between said common drive electrode and electric field sensing electrodes for causing said electric field sensing electrodes to produce a fingerprint image output signal.

18. A fingerprint sensor according to claim 17 wherein each shield electrode comprises an electrically conductive layer surrounding a respective electric field sensing electrode with a dielectric layer therebetween.

19. A fingerprint sensor according to claim 17 further comprising active shield driving means for actively driving each of said shield electrodes.

20. A fingerprint sensor according to claim 19 wherein said active shield driving means comprises an amplifier operatively connected to each electric field sensing electrode and its associated shield electrode for actively driving the shield electrode with a portion of an output signal from the amplifier.

21. A fingerprint sensor according to claim 17 wherein said drive means further comprises a drive circuit for powering said common drive electrode to generate the electric field drive signal having a predetermined frequency.

22. A fingerprint sensor according to claim 17 further comprising a finger electrode positioned adjacent said dielectric layer for contact with the finger.

23. A fingerprint sensor according to claim 17 further comprising synchronous demodulator means operatively connected to said electric field sensing electrodes for synchronously demodulating signals therefrom.

24. A fingerprint sensor according to claim 17 further comprising dynamic contrast enhancing means operatively connected to said electric field sensing electrodes for dynamically enhancing contrast and uniformity of the fingerprint image output signal.

25. A fingerprint sensor according to claim 24 wherein said dynamic contrast enhancing means comprises:
   a capacitor matrix operatively connected to said electric field sensing electrodes; and
   alternating current capacitor matrix drive means for driving said capacitor matrix.

26. A fingerprint sensor according to claim 25 wherein said alternating current capacitor matrix drive means comprises a synchronous demodulator.

27. A fingerprint sensor according to claim 24 wherein said dynamic contrast enhancing means comprises a resistor matrix operatively connected to said electric field sensing electrodes.

28. A fingerprint sensor according to claim 17 further comprising:
   a substrate;
   an active semiconductor layer on said substrate comprising a plurality of semiconductor devices operatively connected to said electric field sensing electrodes; and
   package means for enclosing said substrate, said active semiconductor layer, said electric field sensing electrodes, and said dielectric layer, and wherein said package means has an opening therethrough in registry with said dielectric layer.

29. A fingerprint sensor comprising:
   an array of electric field sensing electrodes;
   a dielectric layer on said electric field sensing electrodes, said dielectric layer for receiving a finger adjacent thereto;
   a respective shield electrode comprising electrically conductive material surrounding each of said electric field sensing electrodes for shielding each electric field sensing electrode from adjacent electric field sensing electrodes;
   active shield driving means for actively driving each of said shield electrodes; and
   drive means for applying an electric field drive signal to said electric field sensing electrodes and adjacent portions of the finger, said drive means comprising a common drive electrode extending beneath at least a plurality of electric field sensing electrodes of said array of electric field sensing electrodes so that the electric field drive signal radiates vertically between said common drive electrode and electric field sensing electrodes for causing said electric field sensing electrodes to produce a fingerprint image output signal.

30. A fingerprint sensor according to claim 29 wherein said active shield driving means comprises an amplifier operatively connected to each electric field sensing electrode and its associated shield electrode for actively driving the shield electrode with a portion of an output signal from the amplifier.

31. A fingerprint sensor according to claim 29 wherein said drive means further comprises a drive circuit for powering said common drive electrode to generate the electric field drive signal having a predetermined frequency.

32. A fingerprint sensor according to claim 29 further comprising a finger electrode positioned adjacent said dielectric layer for contact with the finger.

33. A fingerprint sensor according to claim 29 further comprising synchronous demodulator means operatively connected to said electric field sensing electrodes for synchronously demodulating signals therefrom.

34. A fingerprint sensor according to claim 29 further comprising dynamic contrast enhancing means operatively connected to said electric field sensing electrodes for dynamically enhancing contrast and uniformity of the fingerprint image output signal.

35. A fingerprint sensor according to claim 34 wherein said dynamic contrast enhancing means comprises:
   a capacitor matrix operatively connected to said electric field sensing electrodes; and
   alternating current capacitor matrix drive means for driving said capacitor matrix.

36. A fingerprint sensor according to claim 35 wherein said alternating current capacitor matrix drive means comprises a synchronous demodulator.

37. A fingerprint sensor according to claim 34 wherein said dynamic contrast enhancing means comprises a resistor matrix operatively connected to said electric field sensing electrodes.

38. A fingerprint sensor according to claim 29 further comprising:
   a substrate;
   an active semiconductor layer on said substrate comprising a plurality of semiconductor devices operatively connected to said electric field sensing electrodes and shield electrodes; and
   package means for enclosing said substrate, said active semiconductor layer, said electric field sensing electrodes and shield electrodes, and said dielectric layer, and wherein said package means has an opening therethrough in registry with said dielectric layer.

39. A computer workstation comprising:
   a housing;
   a computer processor positioned within said housing;
   a display operatively connected to said computer processor;
   a keyboard operatively connected to said computer processor; and
   fingerprint sensor means operatively connected to said computer processor and mounted within said housing for protection thereby, said fingerprint sensor means comprising a finger sensing surface exposed through an opening in said housing;
   said computer processor comprising access control means for permitting operation of the computer workstation only upon determining a match between a fingerprint sensed by said fingerprint sensor means and an authorized reference fingerprint;
   said fingerprint sensor means comprising an array of electric field sensing electrodes, a dielectric layer on a first surface of said array of electric field sensing electrodes, said dielectric layer for receiving a finger adjacent thereto, and drive means for applying an electric field drive signal to said array of electric field sensing electrodes and adjacent portions of the finger so that said array of electric field sensing electrodes produce a fingerprint image output signal, said drive means comprising a second dielectric layer on a second surface of said array of electric field sensing electrodes opposite the first surface, and a common drive electrode extending beneath at least a plurality of electric field sensing electrodes of said array of electric field sensing electrodes with the second dielectric layer therebetween so that the electric field drive signal radiates vertically between said common drive electrode and electric field sensing electrodes.

40. A computer workstation according to claim 39 wherein said drive means further comprises a coherent drive circuit for powering said common drive electrode to generate a coherent electric field drive signal having a predetermined frequency.

41. A computer workstation according to claim 39 further comprising a respective shield electrode associated with each of said electric field sensing electrodes for shielding each electric field sensing electrode from adjacent sensing electrodes.

42. A computer workstation according to claim 41 further comprising active shield driving means for actively driving each of said shield electrodes.

43. A computer workstation according to claim 39 further comprising synchronous demodulator means operatively connected to said electric field sensing electrodes for synchronously demodulating signals therefrom.

44. A computer workstation according to claim 39 further comprising dynamic contrast enhancing means operatively connected to said electric field sensing electrodes for dynamically enhancing contrast and uniformity of the fingerprint image output signal.

45. A method for sensing a fingerprint and generating a fingerprint image output signal, the method comprising the steps of:

providing an array of electric field sensing electrodes with a dielectric layer on a first surface of said array of electric field sensing electrodes for receiving a finger adjacent thereto, and further comprising a second dielectric layer on a second surface of said array of electric field sensing electrodes opposite the first surface, and a common drive electrode extending beneath at least a plurality of said array of electric field sensing electrodes with the second dielectric layer therebetween; and applying a coherent electric field drive signal to said array of electric field sensing electrodes and adjacent portions of the finger using the common drive electrode so that the electric field drive signal radiates vertically between the common drive electrode and electric field sensing electrodes to thereby cause said array of electric field sensing electrodes to produce a fingerprint image output signal.

46. A method according to claim 45 further comprising the step of shielding said electric field sensing electrodes by positioning a respective shield electrode surrounding each of said electric field sensing electrodes to shield each electric field sensing electrode from adjacent electric field sensing electrodes.

47. A method according to claim 46 further comprising the step of actively driving each of said shield electrodes with a portion of an output signal from an amplifier associated with each electric field sensing electrode.

48. A method according to claim 45 further comprising the step of synchronously demodulating signals from said electric field sensing electrodes.

49. A method according to claim 45 further comprising the step of dynamic enhancing contrast and uniformity of the fingerprint image output signal.

50. A method for sensing a fingerprint and generating a fingerprint image output signal, the method comprising the steps of:

providing an array of electric field sensing electrodes with a dielectric layer on said electric field sensing electrodes for receiving a finger adjacent thereto and a common drive electrode extending beneath at least a plurality of said array of electric field sensing electrodes;

applying an electric field drive signal to said electric field sensing electrodes and adjacent portions of the finger using the common drive electrode so that the electric field drive signal radiates vertically between the common drive electrode and electric field sensing electrodes to thereby cause said electric field sensing electrodes to produce a fingerprint image output signal; and shielding said electric field sensing electrodes by positioning a respective shield electrode surrounding each of said electric field sensing electrodes to shield each electric field sensing electrode from adjacent sensing electrodes.

51. A method according to claim 50 further comprising the step of actively driving each of said shield electrodes with a portion of an output signal from an amplifier associated with each electric field sensing electrode.

* * * * *